(12) United States Patent
Midha

(10) Patent No.: US 10,291,389 B1
(45) Date of Patent: May 14, 2019

(54) TWO-POINT MODULATOR WITH MATCHING GAIN CALIBRATION

(71) Applicant: STMicroelectronics International N.V., Schiphol (NL)

(72) Inventor: Gagan Midha, Panipat (IN)

(73) Assignee: STMicroelectronics International N.V., Schiphol (NL)

( * ) Notice: Subject to any disclaimer, the term of this patent is extended or adjusted under 35 U.S.C. 154(b) by 16 days.

(21) Appl. No.: 15/923,119

(22) Filed: Mar. 16, 2018

(51) Int. Cl.
*H03L 7/087* (2006.01)
*H04L 7/033* (2006.01)
*H04L 7/00* (2006.01)
*H03L 7/099* (2006.01)
*H04B 1/7073* (2011.01)

(52) U.S. Cl.
CPC ............ *H04L 7/0331* (2013.01); *H03L 7/087* (2013.01); *H03L 7/099* (2013.01); *H04B 1/7073* (2013.01); *H04L 7/0091* (2013.01); *H04B 2201/7073* (2013.01)

(58) Field of Classification Search
CPC ..... H04L 7/033; H04L 7/0337; H04L 7/0331; H04L 7/0338; H03L 7/0814; H03L 7/0891; H03L 7/093; H03L 7/087; H03L 7/18
USPC .................................................. 375/354–376
See application file for complete search history.

(56) References Cited

U.S. PATENT DOCUMENTS

| | | | | |
|---|---|---|---|---|
| 5,111,160 A | * | 5/1992 | Hershberger | ........... H03L 7/095 331/1 A |
| 5,757,238 A | * | 5/1998 | Ferraiolo | ................. H03L 7/089 327/105 |
| 5,781,044 A | * | 7/1998 | Riley | ..................... H03L 7/1974 327/105 |
| 5,834,987 A | * | 11/1998 | Dent | ..................... H03C 3/0925 332/127 |
| 5,978,425 A | * | 11/1999 | Takla | ...................... H03L 7/093 327/159 |

(Continued)

OTHER PUBLICATIONS

Jang, Sungchun, et al.: "An All-Digital Bang-Bang PLL Using Two-Point Modulation and Background Gain Calibration for Spread Spectrum Clock Generation," 2015 Symposium on VLSI Circuits Digest of Technical Papers (2 pages).

(Continued)

*Primary Examiner* — James M Perez

(74) *Attorney, Agent, or Firm* — Crowe & Dunlevy

(57) ABSTRACT

A modulation circuit includes a locked loop circuit with two-point modulation control and a phase-frequency detector configured to compare a reference frequency signal with a feedback frequency signal. A two-point modulation control circuit includes a first modulation path having a controllable gain and coupled to one of the first and second modulation control points and a second modulation path coupled to another of the first and second modulation control points. Gain matching of the first and second modulation paths is accomplished through the operation of a calibration circuit. The calibration circuit includes a phase detector circuit configured to compare the reference frequency signal with the feedback frequency signal to generate a phase detect signal, and a gain control circuit configured to adjust the controllable gain of the first modulation path as a function a correlation of the phase detect signal with signs of the modulation data.

33 Claims, 5 Drawing Sheets

(56) References Cited

U.S. PATENT DOCUMENTS

| | | | | |
|---|---|---|---|---|
| 6,225,928 B1* | 5/2001 | Green | H03M 3/40 | 341/143 |
| 6,515,553 B1* | 2/2003 | Filiol | H03C 3/0925 | 332/127 |
| 6,700,447 B1* | 3/2004 | Nilsson | H03C 3/0925 | 331/1 A |
| 6,822,593 B2* | 11/2004 | Level | H03M 7/3033 | 341/143 |
| 7,236,754 B2* | 6/2007 | Sorrells | H03C 1/36 | 455/102 |
| 7,265,636 B2* | 9/2007 | Dedieu | H03L 7/085 | 327/156 |
| 7,276,966 B1* | 10/2007 | Tham | H03F 1/0222 | 330/136 |
| 7,310,022 B2* | 12/2007 | Doi | H03L 7/085 | 331/34 |
| 7,424,068 B2* | 9/2008 | Visalli | H03M 13/256 | 375/279 |
| 7,606,341 B2* | 10/2009 | Pereira | H04L 7/0337 | 375/224 |
| 7,643,599 B2* | 1/2010 | Willis | H03D 13/003 | 327/12 |
| 7,663,415 B2* | 2/2010 | Chatterjee | H03L 1/022 | 327/147 |
| 7,715,514 B2* | 5/2010 | Takeuchi | H03L 7/0814 | 327/160 |
| 7,734,000 B2* | 6/2010 | Kuo | H03L 7/087 | 375/360 |
| 7,804,926 B2* | 9/2010 | Sanduleanu | H03D 13/003 | 327/157 |
| 7,911,241 B1* | 3/2011 | Zeller | H03L 7/1976 | 327/105 |
| 7,924,101 B1* | 4/2011 | Crawford | H03C 3/0958 | 331/16 |
| 7,974,375 B2* | 7/2011 | Kim | H03L 7/0891 | 327/235 |
| 8,339,165 B2* | 12/2012 | Dunworth | H03L 7/089 | 327/152 |
| 8,358,729 B2* | 1/2013 | Bae | H03L 7/093 | 327/155 |
| 8,368,440 B2* | 2/2013 | Rhee | H03L 7/087 | 327/147 |
| 8,446,191 B2* | 5/2013 | Dunworth | H03L 7/08 | 327/147 |
| 8,674,771 B2* | 3/2014 | Darabi | H03L 7/0898 | 327/156 |
| 8,704,567 B2* | 4/2014 | Ainspan | H03L 7/087 | 327/149 |
| 8,803,627 B1* | 8/2014 | Xu | H03B 5/1228 | 331/16 |
| 8,872,558 B1* | 10/2014 | Rey | H03L 7/087 | 327/149 |
| 8,884,709 B2* | 11/2014 | Badets | H03C 3/0908 | 331/1 A |
| 8,922,253 B2* | 12/2014 | Rey | H03L 7/0802 | 327/108 |
| 9,036,764 B1* | 5/2015 | Hossain | H03L 7/087 | 375/355 |
| 9,172,570 B1* | 10/2015 | Li Puma | H04L 27/04 | |
| 9,197,224 B2* | 11/2015 | Kinget | H04L 27/18 | |
| 9,197,403 B2* | 11/2015 | Gauthier | H04L 7/0331 | |
| 9,225,507 B1* | 12/2015 | Lye | H04L 7/0331 | |
| 9,246,499 B2* | 1/2016 | Balachandran | H03L 7/099 | |
| 9,325,324 B1* | 4/2016 | Gupta | H03L 7/1072 | |
| 9,331,681 B2* | 5/2016 | Midha | H03K 3/84 | |
| 9,344,271 B1* | 5/2016 | Dusatko | H04L 7/0331 | |
| 9,391,625 B1* | 7/2016 | Xu | H03L 7/0992 | |
| 9,793,906 B1* | 10/2017 | Midha | H03L 7/083 | |
| 9,853,650 B1* | 12/2017 | Kuan | H03L 7/087 | |
| 9,853,807 B2* | 12/2017 | Tsai | H03L 7/0994 | |
| 9,923,566 B1* | 3/2018 | Kumar | H03C 3/095 | |
| 9,935,640 B1* | 4/2018 | Chan | H03L 7/099 | |
| 9,979,408 B2* | 5/2018 | Mayer | H03L 7/0891 | |
| 10,027,333 B2* | 7/2018 | Lahiri | H03L 7/1976 | |
| 10,090,845 B1* | 10/2018 | Midha | H03L 7/093 | |
| 2002/0033737 A1* | 3/2002 | Staszewski | H03L 7/093 | 331/17 |
| 2003/0039330 A1* | 2/2003 | Castiglione | H03L 7/0898 | 375/376 |
| 2003/0043950 A1* | 3/2003 | Hansen | H03C 3/0925 | 375/376 |
| 2004/0036639 A1* | 2/2004 | Hammes | H03C 3/0925 | 341/143 |
| 2004/0124938 A1* | 7/2004 | Nilsson | H03C 3/0925 | 332/112 |
| 2004/0192231 A1* | 9/2004 | Grewing | H03C 3/0925 | 455/102 |
| 2004/0223575 A1* | 11/2004 | Meltzer | H03D 13/003 | 375/376 |
| 2004/0223576 A1* | 11/2004 | Albasini | H03L 7/0891 | 375/376 |
| 2004/0232947 A1* | 11/2004 | Temporiti Milani | H03D 13/004 | 327/2 |
| 2004/0232960 A1* | 11/2004 | Albasini | H03L 7/1976 | 327/156 |
| 2004/0252804 A1* | 12/2004 | Aoyama | H03D 13/004 | 375/376 |
| 2005/0001689 A1* | 1/2005 | Albasini | H03L 7/0891 | 331/16 |
| 2006/0139109 A1* | 6/2006 | Oustaloup | H03H 7/06 | 331/17 |
| 2006/0202767 A1* | 9/2006 | Nayler | H03L 7/06 | 331/16 |
| 2006/0232344 A1* | 10/2006 | Badets | H03L 7/087 | 331/16 |
| 2007/0018735 A1* | 1/2007 | Sirito-Olivier | H03L 7/10 | 331/16 |
| 2008/0007346 A1* | 1/2008 | Jensen | H03C 3/0925 | 331/16 |
| 2008/0007365 A1* | 1/2008 | Venuti | H03C 3/0925 | 331/179 |
| 2008/0042753 A1* | 2/2008 | Bauernfeind | H03C 3/0925 | 331/1 A |
| 2008/0072025 A1* | 3/2008 | Staszewski | G06F 9/30032 | 712/241 |
| 2008/0095269 A1* | 4/2008 | Frantzeskakis | H03C 5/00 | 375/302 |
| 2008/0129351 A1* | 6/2008 | Chawla | H03C 3/0925 | 327/156 |
| 2008/0292311 A1* | 11/2008 | Daghighian | H04B 10/40 | 398/9 |
| 2008/0315928 A1* | 12/2008 | Waheed | G04F 10/005 | 327/159 |
| 2009/0206941 A1* | 8/2009 | Wang | H03C 3/0925 | 332/119 |
| 2009/0258612 A1* | 10/2009 | Zhuang | H03C 5/00 | 455/110 |
| 2009/0268791 A1* | 10/2009 | Waheed | H03L 7/099 | 375/219 |
| 2009/0275358 A1* | 11/2009 | Feltgen | H03C 3/0925 | 455/550.1 |
| 2010/0135368 A1* | 6/2010 | Mehta | H04L 27/38 | 375/219 |
| 2010/0188148 A1* | 7/2010 | Mehta | H03F 1/30 | 330/149 |
| 2010/0283665 A1* | 11/2010 | Bashir | H04B 1/0475 | 342/174 |
| 2011/0148372 A1* | 6/2011 | Mariani | H02M 3/156 | 323/272 |
| 2011/0249702 A1* | 10/2011 | Le-Gall | H03K 5/19 | 375/130 |
| 2011/0298507 A1* | 12/2011 | Jakobsson | H03L 7/07 | 327/156 |
| 2012/0126866 A1* | 5/2012 | Hsieh | H03L 7/087 | 327/157 |
| 2013/0015892 A1* | 1/2013 | Badets | H03C 3/0908 | 327/117 |

(56) References Cited

U.S. PATENT DOCUMENTS

| | | | | |
|---|---|---|---|---|
| 2013/0093524 | A1* | 4/2013 | Nakamura | H03L 7/02 |
| | | | | 331/34 |
| 2014/0106681 | A1* | 4/2014 | Leung | H04B 1/62 |
| | | | | 455/73 |
| 2015/0123721 | A1* | 5/2015 | Midha | H03K 3/84 |
| | | | | 327/164 |
| 2015/0146835 | A1* | 5/2015 | Gauthier | H04L 7/0331 |
| | | | | 375/376 |
| 2016/0126892 | A1* | 5/2016 | Huang | H03B 5/1265 |
| | | | | 331/8 |
| 2017/0141857 | A1* | 5/2017 | Casagrande | H04B 17/11 |
| 2017/0195113 | A1* | 7/2017 | Smaini | H03C 3/0916 |
| 2017/0207906 | A1* | 7/2017 | Dawkins | H04L 7/0331 |
| 2017/0214408 | A1* | 7/2017 | Liang | H03L 7/099 |
| 2017/0310458 | A1* | 10/2017 | Zanuso | H03L 7/087 |
| 2017/0338940 | A1* | 11/2017 | Zanuso | H04L 7/033 |
| 2017/0366376 | A1* | 12/2017 | Wang | H03L 7/093 |
| 2018/0062661 | A1* | 3/2018 | Kumar | H03C 3/095 |
| 2018/0097521 | A1* | 4/2018 | Hammerschmidt | H03L 7/0893 |
| 2018/0145695 | A1* | 5/2018 | Lahiri | H03L 7/1976 |
| 2018/0159544 | A1* | 6/2018 | Kumar | H03C 3/095 |
| 2018/0287620 | A1* | 10/2018 | Midha | H03L 7/093 |

OTHER PUBLICATIONS

Unterassinger, Hartwig et al.: "Investigation of Two-Point Modulation to Increase the GFSK Data Rate of PLL-Based Wireless Transceivers of Wireless Sensor Nodes," 2013 9th Conference on Ph.D. Research in Microelectronics and Electronics (PRIME), 2013 (pp. 89-92).

Yu, Shih-An, et al.: "A 0.65-V 2.5-GHz Fractional-N Synthesizer With Two-Point 2-Mb/s GFSK Data Modulation," IEEE Journal of Solid-State Circuits (vol. 44, Issue: 9, Sep. 2009) (pp. 2411-2425).

* cited by examiner

TWO-POINT MODULATOR WITH MATCHING GAIN CALIBRATION

TECHNICAL FIELD

The present invention relates to a two-point modulator and, in particular, to a calibration process for addressing gain mismatch between modulator paths.

BACKGROUND

FIG. 1 shows a block diagram for a conventional two-point modulator 10 which includes a phase lock loop (PLL) 12 that synthesizes a carrier frequency from a reference frequency (fref). The PLL 12 includes a voltage controlled oscillator (VCO) 20 generating a modulated frequency output signal (fout) having a central frequency which is set to the desired carrier frequency. The modulated frequency output signal fout is applied to the input of programmable divider (DIV) 22 which divides the modulated frequency output signal fout to generate a feedback frequency signal (ffb). A phase-frequency detector (PFD) 24 operates to compare the phase-frequency of the feedback frequency signal ffb to the phase-frequency of the reference frequency fref and generate a control signal 26 responsive to the phase-frequency difference. The control signal 26 drives the operation of a charge pump (CP) 28 to generate a control voltage signal 30. The control voltage signal 30 is filtered by a low pass filter (LPF) 32 and applied to the control input of the voltage controlled oscillator 20 as a voltage control signal (Vc). The frequency of the modulated frequency output signal fout generated by the voltage controlled oscillator 20 in response to the voltage control signal Vc is set as a function of the filtered control voltage signal 30.

The carrier frequency is determined by a digital control signal (fc) that is provided to an input of a sigma-delta ($\Sigma\Delta$) modulator (SDM) 40 as a modulation control signal (Mc). The output of the sigma-delta modulator 40 is applied to a control input of the programmable divider 22 in order to set the average division ratio of the programmable divider 22. As an example, the output of the sigma-delta modulator 40 may be coded on one bit, with the logic value of this bit selecting the division ratio of either N or N+1, where N is an integer. Thus, the central frequency of the modulated frequency output signal fout is selectable between two values of N*fref and (N+1)*fref. If the output of the sigma-delta modulator 40 is instead coded on multiple bits, these bits will select one of several consecutive values for the central frequency of the modulated frequency output signal fout.

The two-point modulation is performed using two correlated modulation signals that respectively modulate: the filtered control voltage signal 30 setpoint at the output of the low pass filter 32 through modulation path (a), and the carrier frequency setpoint at the input of the sigma-delta modulator 40 through modulation path (b).

The digital data, also referred to in the art as the modulation data signal, is filtered by a transmit filter (TX-Filter) 50 (for example, a Gaussian filter). With respect to path (a), the filtered digital data 52 is converted by a modulation digital to analog converter (DAC) 54 to an analog voltage signal 56. An analog summation circuit 58 adds the analog voltage signal 54 to the filtered control voltage signal 30 for application to the input of the voltage controlled oscillator 20 as the voltage control signal (Vc). With respect to path (b), this filtered digital data 52 is added by a digital summation circuit 60 to the digital control signal fc for application to the input of the sigma-delta modulator 40 as the modulation control signal (Mc).

Those skilled in the art understand that the transfer function (Hb(s)) applied to the modulation seen from the programmable divider 22 through the operation of modulation path (b) exhibits a low pass behavior while the transfer function (Ha(s)) applied to the modulation seen from the digital to analog converter 54 through the operation of modulation path (a) exhibits a high pass behavior. If the sum of these two transfer functions is equal to a constant (i.e., Ha(s)+Hb(s)=1), then the bandwidth of the modulator 10 is infinite. This advantageous operating condition is achieved when the respective gains of the modulation paths (a) and (b) passing through the digital to analog converter 54 and programmable divider 22, respectively, are identical. If the gains are not matched, however, erroneous modulation of the modulated frequency output signal fout occurs.

Because the modulation path (b) is fully digital in nature, there is an inherent accuracy. The gain of modulation path (a), however, which is partially digital and partially analog, is inaccurate because the gain of the digital to analog converter 54 is process, voltage and temperature (PVT) dependent. To achieve gain matching, a calibration procedure is needed to offset this PVT dependence. In a common practice, for example before a transmit operation, the gain of the digital to analog converter 54 is calibrated (to match the path (b) gain) using a frequency lock loop (FLL) process. This calibration will not, however, address temperature variation. Additionally, the calibration process can take too long to complete (for example, not being able to be completed between channel switching operations when the two-point modulator is a component of an RF transceiver circuit).

There is accordingly a need in the art for a better calibration process which addresses some, or all, of the foregoing concerns.

SUMMARY

In an embodiment, a modulation circuit comprises: a locked loop circuit with two-point modulation control comprising a first modulation control point at an input of a voltage controlled oscillator and a second modulation control point at an input of a controllable divider, said locked loop circuit including a phase-frequency detector configured to compare a reference frequency signal with a feedback frequency signal output from the controllable divider; a two-point modulation control circuit configured to receive an input modulation data and generate a first modulation control signal for application to the first modulation control point and generate a second modulation control signal for application to the second modulation control point, wherein a gain of the first modulation control signal is set by a gain control signal; and a calibration circuit comprising: a phase detector circuit configured to compare the reference frequency signal with the feedback frequency signal to generate a phase detect signal; and a gain control circuit configured to generate the gain control signal as a function of at least the phase detect signal.

In an embodiment, a method is provided for use in connection with the operation of a two-point modulator which includes a modulation path for generating a modulation voltage for application to a voltage controlled oscillator of a locked loop circuit. The method comprises the steps of: phase comparing a reference frequency signal of the locked loop circuit to a feedback frequency signal of the locked loop circuit to generate a phase detect signal; and adjusting a gain of the modulation path for generating the modulation voltage as a function of at least the phase detect signal.

In an embodiment, a modulation circuit comprises: a locked loop circuit with two-point modulation control comprising a first modulation control point at an input of a voltage controlled oscillator and a second modulation control point at an input of a controllable divider, said locked loop circuit including a phase-frequency detector configured to compare a reference frequency signal with a feedback frequency signal output from the controllable divider; a two-point modulation control circuit including a first modulation path having a controllable gain and coupled to one of the first and second modulation control points and having a second modulation path coupled to another of the first and second modulation control points; a calibration circuit comprising: a phase detector circuit configured to compare the reference frequency signal with the feedback frequency signal to generate a phase detect signal; and a gain control circuit configured to adjust the controllable gain of the first modulation path as a function of at least the phase detect signal.

BRIEF DESCRIPTION OF THE DRAWINGS

The accompanying drawings are included to provide a further understanding of the invention and are incorporated in and constitute a part of this specification, illustrate embodiments of the invention and together with the description serve to explain the principles of the invention.

In the drawings.

DETAILED DESCRIPTION

Figure 1:
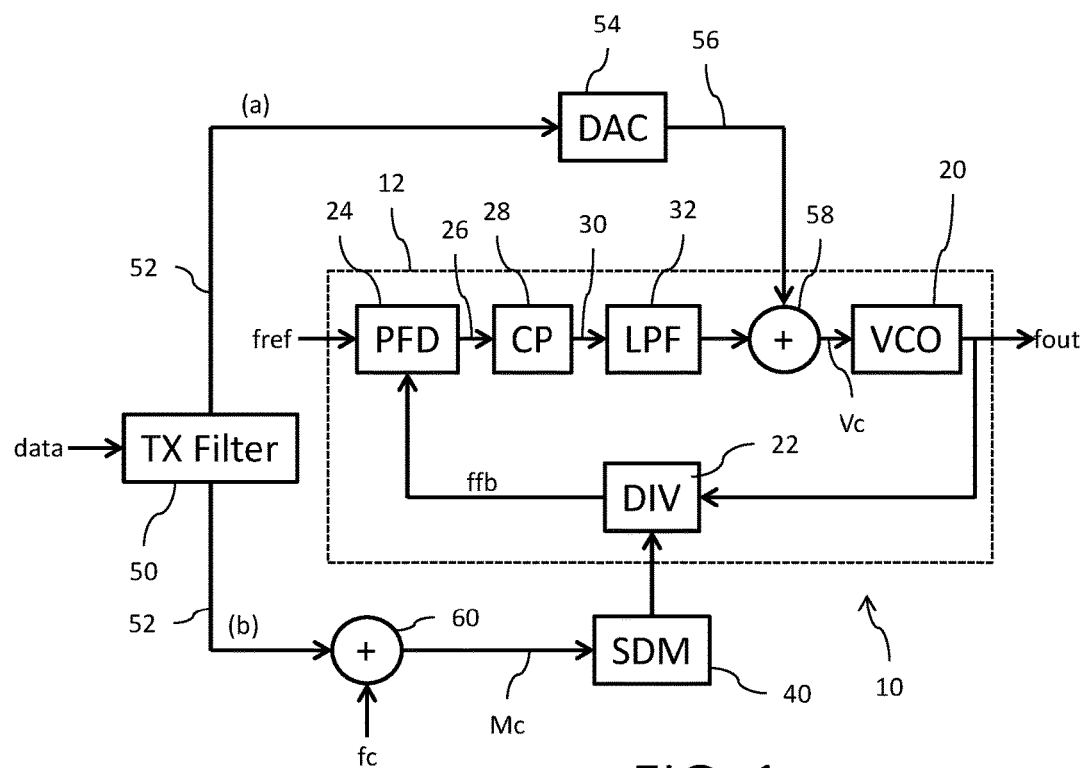
FIG. 1 is a block diagram for a conventional two-point modulator circuit.
Figure 2:
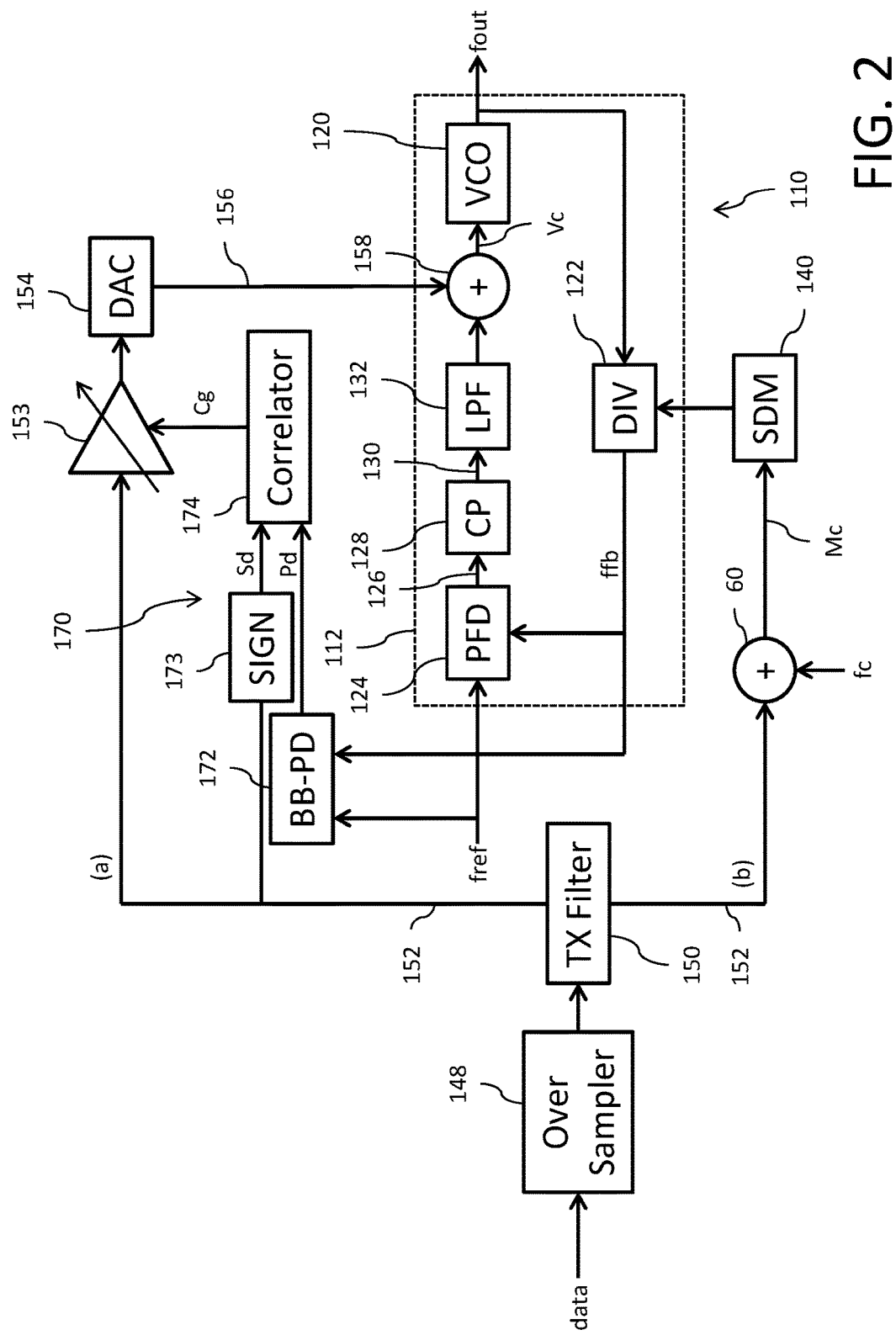
FIG. 2 is a block diagram for a two-point modulator circuit.

Reference is now made to FIG. 2 which shows a block diagram for a two-point modulator 110 which includes a phase lock loop (PLL) 112 that synthesizes a carrier frequency from a reference frequency (fref). The PLL 112 includes a voltage controlled oscillator (VCO) 120 generating a modulated frequency output signal (fout) having a central frequency which is set to the desired carrier frequency. The modulated frequency output signal fout is applied to the input of programmable divider (DIV) 122 which divides the modulated frequency output signal fout to generate a feedback frequency signal (ffb). A phase-frequency detector (PFD) 124 operates to compare the phase-frequency of the feedback frequency signal ffb to the phase-frequency of the reference frequency fref and generate a control signal 126 responsive to the phase-frequency difference. The control signal 126 drives the operation of a charge pump (CP) 128 to generate a control voltage signal 130. The control voltage signal 130 is filtered by a low pass filter (LPF) 132 and applied to the control input of the voltage controlled oscillator 120 as a voltage control signal (Vc). The frequency of the modulated frequency output signal fout generated by the voltage controlled oscillator 120 in response to the voltage control signal Vc is set as a function of the filtered control voltage signal 130.

The carrier frequency is determined by a digital control signal (fc) that is provided to an input of a sigma-delta (ΣΔ) modulator (SDM) 140 as a modulation control signal (Mc). The output of the sigma-delta modulator 140 is applied to a control input of the programmable divider 122 in order to set the average division ratio of the programmable divider 122. As an example, the output of the sigma-delta modulator 140 may be coded on one bit, with the logic value of this bit selecting the division ratio of either N or N+1, where N is an integer. Thus, the central frequency of the modulated frequency output signal fout is selectable between two values of N*fref and (N+1)*fref. If the output of the sigma-delta modulator 140 is instead coded on multiple bits, these bits will select one of several consecutive values for the central frequency of the modulated frequency output signal fout.

The two-point modulation is performed using two correlated modulation signals that respectively modulate: the filtered control voltage signal 130 setpoint at the output of the low pass filter 132 through modulation path (a), and the carrier frequency setpoint at the input of the sigma-delta modulator 140 through modulation path (b).

The digital data, also referred to in the art as the modulation data signal, is oversampled by an oversampling circuit 148 and then filtered by a transmit filter (TX-Filter) 150 (for example, a Gaussian filter). With respect to path (a), the oversampled and filtered digital data 152 is gain adjusted by a variable gain circuit 153 and then converted by a modulation digital to analog converter (DAC) 154 to an analog voltage signal 156. An analog summation circuit 158 adds the analog voltage signal 154 to the filtered control voltage signal 130 for application to the input of the voltage controlled oscillator 120 as the voltage control signal (Vc). With respect to path (b), the oversampled and filtered digital data is added by a digital summation circuit 160 to the digital control signal fc for application to the input of the sigma-delta modulator 140 as the modulation control signal (Mc).

As noted elsewhere herein, it is critical for operation of the modulator 110 for the respective gains of the modulation paths (a) and (b) passing through the digital to analog converter 54 and programmable divider 22, respectively, to be identical. The gain matching function is accomplished through the variable gain circuit 153 which receives a gain control signal (Cg) generated by a calibration circuit 170. The calibration circuit 170 includes a bang-bang phase detector 172, a sign detector 173 and a correlator circuit 174.

A first input of the bang-bang phase detector 172 receives the feedback frequency signal ffb and a second input of the bang-bang phase detector 172 receives the reference frequency fref. As known to those skilled in the art, a bang-bang phase detector (also known in the art as an Alexander phase detector) operates to sample one of the input signals at three discrete points in time set by edges of the other one of the input signals. The logic values for the three samples are then logically combined (for example, using an XOR-based logic circuit) to generate a phase detect output signal (Pd) whose logic state is indicative of the difference in phase between the two input signals. In other words, a first logic state for the output signal Pd indicates whether the first input signal is leading the second input signal in phase and a second logic state for the output signal Pd indicates whether the second input signal is leading the first input signal in phase.

Gain mismatch between the modulation paths (a) and (b) will cause the phase at the phase-frequency detector (PFD) 124 to lag or lead depending on the symbol bit value of "1" or "0."

Figure 3A:
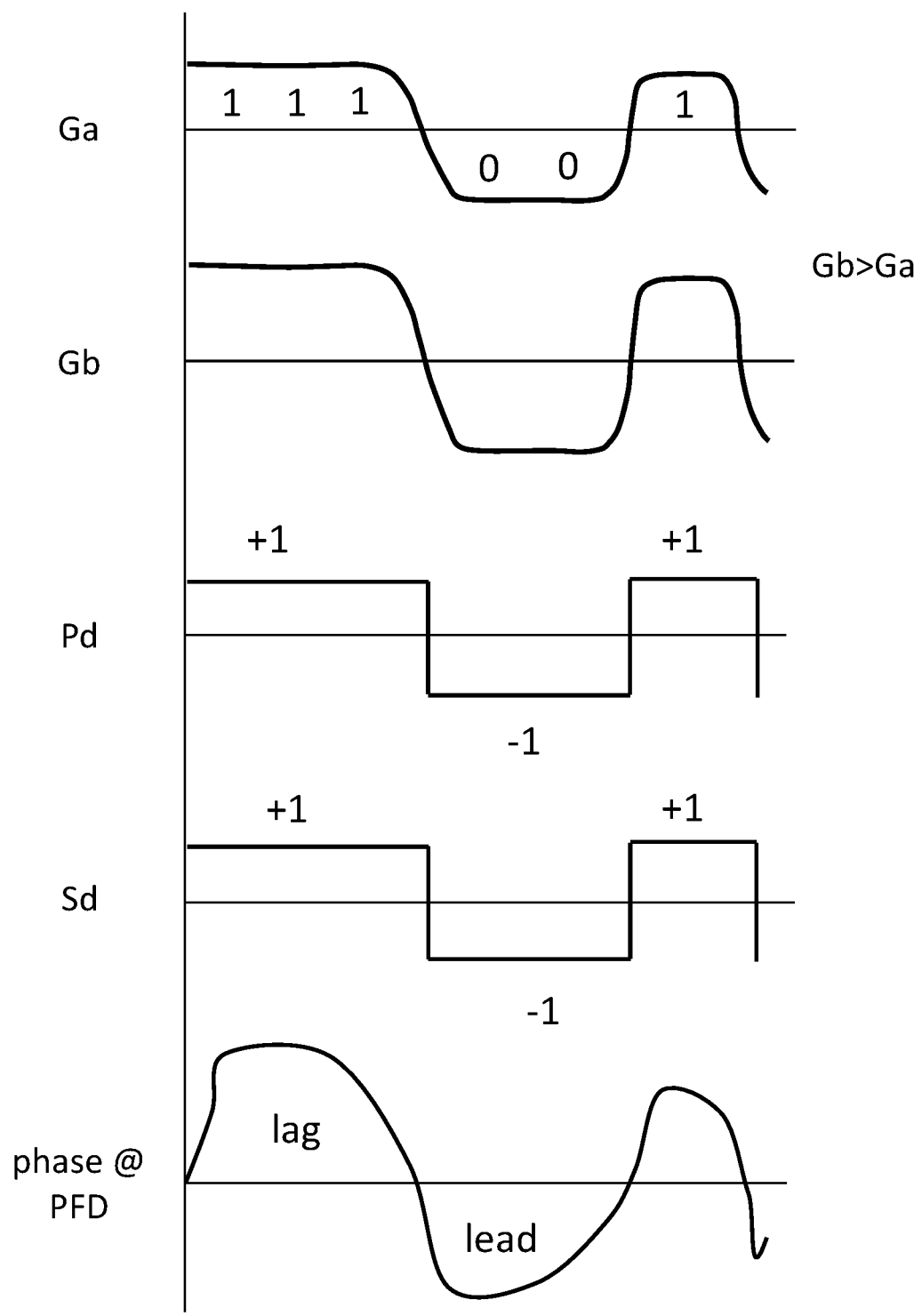
FIGS. 3A-3C show operational waveforms for the circuit of FIG. 2.

So, for a gain mismatch where the modulation path (b) gain is greater than the modulation path (a) gain, as shown in FIG. 3A, the phase at the phase-frequency detector (PFD) 124 will lag for a symbol bit of "1" and the corresponding output Pd of the bang-bang phase detector 172 will be "+1" and the phase will lead for a symbol bit of "0" and the corresponding output Pd of the bang-bang phase detector 172 will be "−1". In this scenario, the phase detect output signal Pd is a periodic sequence of +1 and −1 pulses having a same polarity as the signal 152 output from the transmit filter 150. See, FIG. 3A where signals Ga and Gb show the modulation for paths (a) and (b), respectively, having a gain relationship where Gb>Ga, and the resulting phase detect output signal Pd whose polarity "+1, −1, +1" matches the polarity of the data "111001" of the transmit filter output.

Figure 3B:
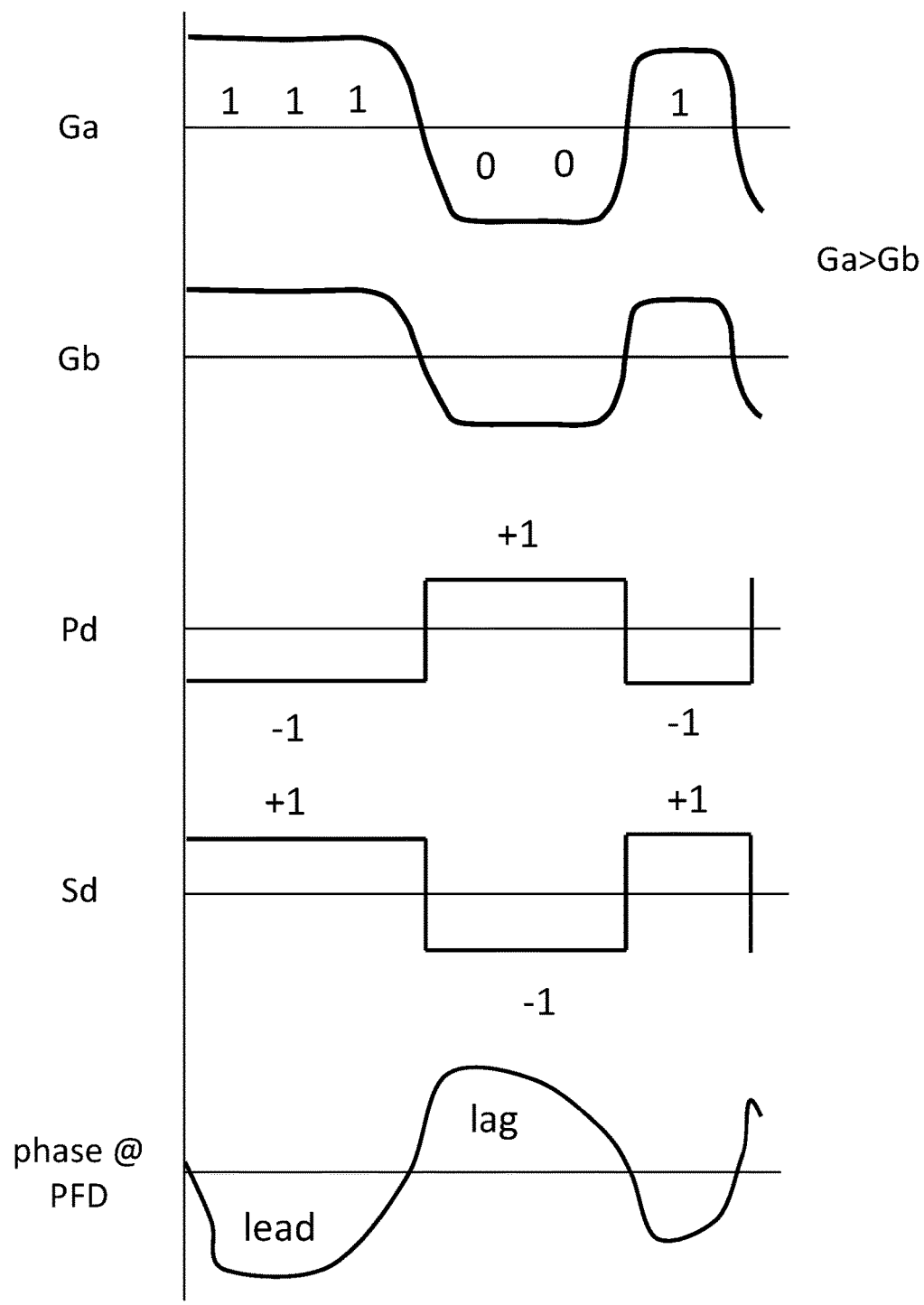

Conversely, for a gain mismatch where the modulation path (a) gain is greater than the modulation path (b) gain, as shown in FIG. 3B, the phase at the phase-frequency detector (PFD) 124 will lead for a symbol bit of "1" and the corresponding output Pd of the bang-bang phase detector 172 will be "−1" and the phase will lag for symbol bit of "0" and the corresponding output Pd of the bang-bang phase detector 172 will be "+1". In this scenario, the phase detect output signal Pd is a periodic sequence of +1 and −1 pulses having a polarity that is the inverse of the polarity of the signal 152 output from the transmit filter 150 (i.e., 180° out of phase). See, FIG. 3B where signals Ga and Gb show the modulation for paths a) and b), respectively, having a gain relationship where Ga>Gb and the resulting phase detect output signal Pd whose polarity "−1, +1, −1" is the inverse of the polarity of the data "111001" of the transmit filter output.

In the event the gains of the modulation paths (a) and (b) are equal, the phase detect output signal Pd has a random logic value which corresponds to system noise. See, FIG. 3C where signals Ga and Gb show the modulation for paths a) and b), respectively, having a gain relationship where Gb=Ga and the resulting phase detect output signal Pd exhibiting a random value.

The oversampled and filtered digital data 152 is processed by the sign detector 173 which generates a signed data signal Sd whose logic value corresponds solely to the sign of the oversampled and filtered digital data 152. So, if the oversampled and filtered digital data 152 has a positive value then the signed data signal Sd has a first logic value (for example, +1) and conversely if the oversampled and filtered digital data 152 has a negative value then the signed data signal Sd has a second logic value (for example, −1). See, signal Sd, FIGS. 3A-3C.

A first input of the correlator circuit 174 receives the signed data signal Sd and a second input of the correlator circuit 174 receives the phase detect output signal Pd. The logic state of the phase detect output signal Pd is correlated with the logic state of signed data signal Sd (and thus is effectively being correlated with the logic state of the bit of the digital data itself). The correlation window implemented by the correlator circuit 174 is selectable so as to control the rate at which the correlator circuit 174 outputs the gain control signal Cg. A larger correlation window will produce a more accurate estimate of the difference in gains (Ga versus Gb) of path a) and path b). However, with this configuration it will take more time to reach the correct gain setting of the gain control signal Cg applied to the variable gain circuit 153. Additionally, this configuration requires a larger amount of circuit hardware to implement. So, it is important to choose the window size according to a compromise between the foregoing two conflicting needs higher accuracy and reduced circuit area with speed.

Figure 3C:
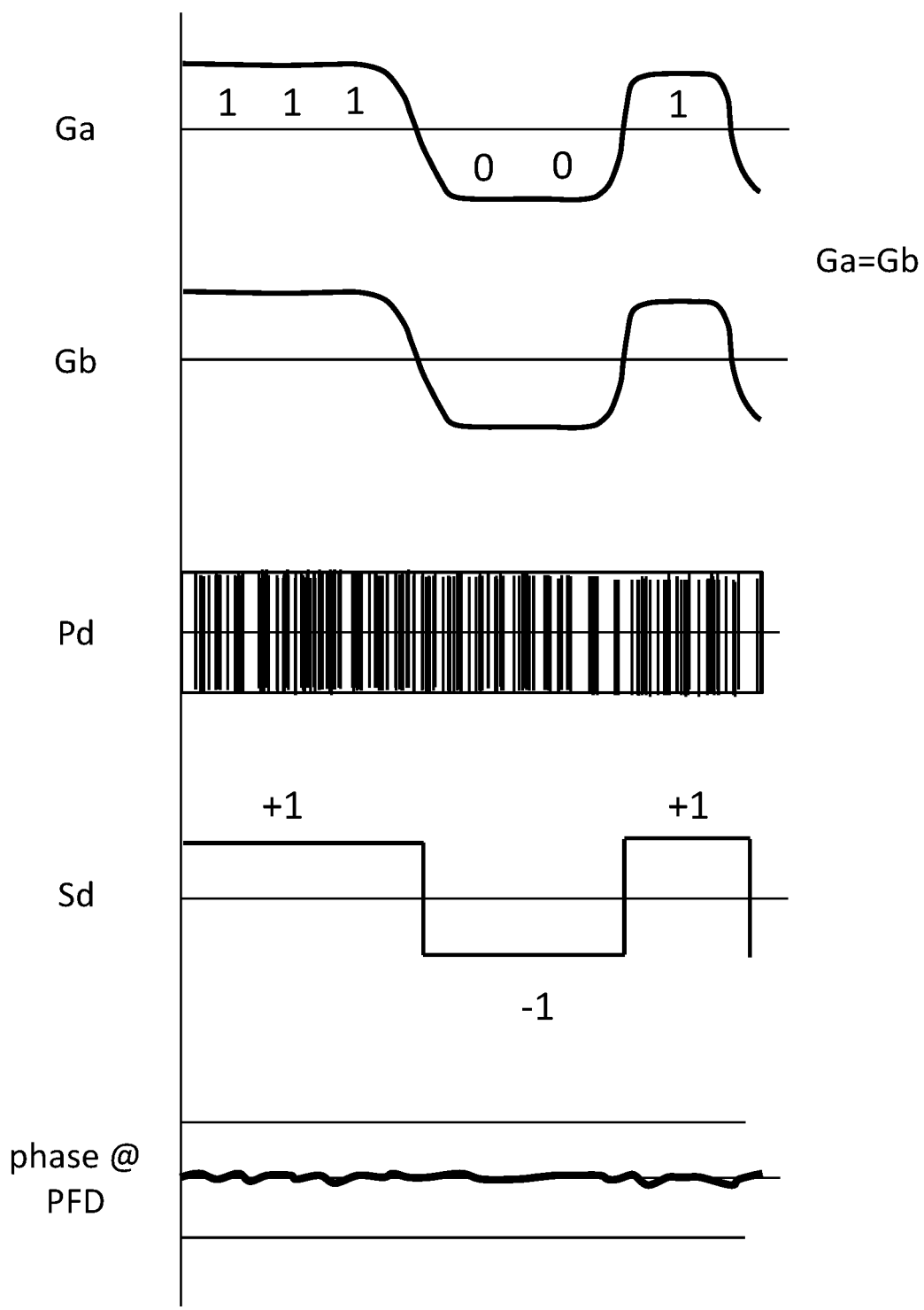

When the gain mismatch is due to the gain of the modulation path (b) being greater than the gain of the modulation path (a) (as shown in FIG. 3A), the correlator circuit 174 generates the gain control signal Cg having a positive correlation value whose magnitude is higher the more correlated the two signals are. The variable gain circuit 153 responds to this condition by increasing a value of the gain that is applied to the oversampled and filtered digital data 152. The goal is to drive the gain values to be equal as shown in FIG. 3C.

Conversely, when the gain mismatch is due to the gain of the modulation path (a) being greater than the gain of the modulation path (b) (as shown in FIG. 3B), the correlator circuit 174 generates the gain control signal Cg having a negative correlation value whose magnitude is higher the more uncorrelated the two signals are. The variable gain circuit 153 responds to this condition by decreasing the value of the gain that is applied to the oversampled and filtered digital data 152. The goal is to drive the gain values to be equal as shown in FIG. 3C.

In the case where the gains of the modulation paths (a) and (b) are equal, the correlator circuit 174 generates the gain control signal Cg having an intermediate value (for example, at or near 0). The variable gain circuit 153 responds to this condition by making no change to the value of the gain that is applied to the oversampled and filtered digital data 152.

The oversampling performed by the oversampling circuit 148 may, for example, take 24 samples of each symbol bit. For the example shown with six bits of data "111001," there will be a total of 24*6 sample points in the oversampled and filtered digital data 152. The bang-bang phase detector 172 is sampled by the feedback frequency signal ffb. So, for the gain mismatch noted above where the modulation path (b) gain is greater than the modulation path (a) gain, the phase detect output signal Pd will be "+1" for 24*3 sample points, "−1" for 24*2 sample points and "+1" for 24*1 sample points. The phase detect output signal Pd accordingly behaves like the signed data signal Sd. Conversely, for the gain mismatch noted above where the modulation path (a) gain is greater than the modulation path (b) gain, the phase detect output signal Pd will be "−1" for 24*3 sample points, "+1" for 24*2 sample points and "−1" for 24*1 sample points. The phase detect output signal Pd in this case accordingly behaves like the inverse of the signed data signal Sd.

The correlation of the signed data signal Sd and the phase detect output signal Pd will therefore give an estimate of the difference in gains of the modulation paths (a) and (b). The correlation here is a mathematical operation in accordance with the following equation:

$$\text{Corr} = \Sum_{n=0}^{N} BB_{out}(n) * \text{mod}_s(n)$$

where: $BB_{out}$ is the phase detect output signal Pd from the bang-bang phase detector 172; $Mod_s$ is the signed data signal Sd output from the sign detector 173; n is the sampling index over time and N is the correlation window size (where N will typically be multiple symbols long in order for a good estimate to be obtained).

With reference to FIG. 3A, where the gain of the modulation path (b) is greater than the gain of the modulation path (a), the "+1" and "−1" values of the phase detect output signal Pd and the "+1" and "−1" values of the signed data signal Sd will correspond to each other over the N samples and the correlation value (Corr) that is generated will have a positive value (with a maximum value of +N where all samples correlate). The gain of the variable gain circuit 153 is increased in response to the positive correlation value (for example, increased in a manner proportional to the magnitude of the correlation value). Conversely, where the gain of the modulation path (a) is greater than the gain of the modulation path (b), the "+1" and "−1" values of the phase detect output signal Pd and the "+1" and "−1" values of the signed data signal Sd will not correspond to each other over the N samples and the correlation value (Corr) that is generated will have a negative value (with a maximum value of −N where no samples correlate). The gain of the variable gain circuit 153 is decreased in response to the negative correlation value (for example, decreased in a manner proportional to the magnitude of the correlation value).

In order to avoid oscillation of the change in gain of the variable gain circuit 153, a hysteresis or threshold may be imposed on the generated correlation value whereby a change in value or a certain magnitude of the value must be satisfied before the correlation value is used to increase or decrease the gain of the variable gain circuit 153.

The operation of the calibration circuit 170 takes advantage of the following: the modulation that is added at the input of the voltage controlled oscillator 120 by modulation path (a) is the same modulation that is cancelled at the input of the programmable divider 122 by the modulation path (b). So, after each symbol period of the data signal, and in the presence of a mismatch in gain, then the phase (on average) as detected by the bang-bang phase detector 172 will be either leading or lagging based on the symbol bit. This difference in phase is used to control the adjustment of the value of the gain that is applied to the oversampled and filtered digital data 152 by the variable gain circuit 153. This negative feedback loop operation of the calibration circuit 170 operates online and continuously to drive the phase to match, at which point the gains of the modulation paths (a) and (b) will be equal.

An advantage of the disclosed calibration solution is speed. The calibration is performed in real time with the communication transmission rather than an offline configuration where communication must be interrupted to permit calibration to occur. Because of this fact, the modulator 10 can operate with a fast channel switching performance. The architecture further supports an improved modulation index which approaches at least 0.55. This results in a significant improvement in demodulation signal to noise ratio (SNR) by around 1 dB. A further advantage of the calibration solution is that it produces a solution that is process, voltage and temperature insensitive. Additionally, a circuit that performs as needed but occupies a reduced circuit area and power can be designed.

The two point modulator implementation shown in FIG. 2 may be used in a number of applications including: a frequency modulated transmitter; a wideband modulation phase lock loop (PLL) for RF transmission or a wideband spread spectrum clock generator.

It will be apparent to those skilled in the art that various modifications and variations can be made in the present invention without departing from the spirit or scope of the invention. Thus, it is intended that the present invention cover the modifications and variations of this invention provided they come within the scope of the appended claims and their equivalents.

The invention claimed is:

1. A modulation circuit, comprising:
    a locked loop circuit with two-point modulation control comprising a first modulation control point at an input of a voltage controlled oscillator and a second modulation control point at an input of a controllable divider, said locked loop circuit including a phase-frequency detector configured to compare a reference frequency signal with a feedback frequency signal output from the controllable divider;
    a two-point modulation control circuit configured to receive an input modulation data and generate a first modulation control signal for application to the first modulation control point and generate a second modulation control signal for application to the second modulation control point, wherein a gain of the first modulation control signal is set by a gain control signal; and
    a calibration circuit comprising:
        a phase detector circuit configured to compare the reference frequency signal with the feedback frequency signal to generate a phase detect signal; and
        a gain control circuit configured to generate the gain control signal as a function of at least the phase detect signal.

2. The modulation circuit of claim 1, wherein the gain control circuit comprises a correlation circuit configured to correlate the phase detect signal to a sign signal to generate the gain control signal, wherein values of the sign signal correspond to the input modulation data.

3. The modulation circuit of claim 2, further comprising an oversampling circuit configured to oversample the input modulation data and generate oversampled modulation data and wherein the calibration circuit further comprises a sign detector configured to detect a sign of the oversampled modulation data and output the sign signal.

4. The modulation circuit of claim 1, wherein the phase detector circuit is a bang-bang phase detector with the feedback frequency signal sampling the reference frequency signal.

5. The modulation circuit of claim 1, further comprising an oversampling circuit configured to oversample the input modulation data.

6. The modulation circuit of claim 4, wherein the two-point modulation control circuit receives the oversampled input modulation data and filters the oversampled input modulation data.

7. The modulation circuit of claim 5, wherein the gain control circuit is configured to generate the gain control signal as a function of a comparison of the phase detect signal to the oversampled input modulation data.

8. The modulation circuit of claim 7, wherein the gain control circuit comprises a correlation circuit configured to correlate the phase detect signal to the oversampled input modulation data to generate the gain control signal.

9. The modulation circuit of claim 1, wherein the modulation circuit is one of: a frequency modulated transmitter; a wideband modulation phase lock loop (PLL) for RF transmission or a wideband spread spectrum clock generator.

10. A method for use in connection with the operation of a two-point modulator which includes a modulation path for generating a modulation voltage for application to a voltage controlled oscillator of a locked loop circuit, comprising the steps of:
    phase-frequency comparing a reference frequency signal of the locked loop circuit to a feedback frequency signal of the locked loop circuit to generate a voltage control signal applied to an input of the voltage controlled oscillator;
    phase comparing the reference frequency signal of the locked loop circuit to the feedback frequency signal of the locked loop circuit to generate a phase detect signal;

adjusting a gain of the modulation path for generating the modulation voltage as a function of at least the phase detect signal; and adding the modulation voltage to the voltage control signal.

11. The method of claim 10, further comprising correlating the phase detect signal to a sign signal to generate a gain control signal, wherein values of the sign signal correspond to the input modulation data.

12. The method of claim 11, further comprising oversampling the input modulation data to generate oversampled modulation data and detecting a sign of the oversampled modulation data to generate the sign signal.

13. The method of claim 12, further comprising:
filtering the oversampled modulation data; and
processing the filtered and oversampled modulation data through the modulation path.

14. The method of claim 11, wherein correlating comprises comparing a sign of the phase detect signal to a sign of the sign signal to generate the gain control signal.

15. The method of claim 10, wherein phase comparing comprises bang-bang phase detecting with the feedback frequency signal sampling the reference frequency signal.

16. A modulation circuit, comprising:
a locked loop circuit with two-point modulation control comprising a first modulation control point at an input of a voltage controlled oscillator and a second modulation control point at an input of a controllable divider, said locked loop circuit including a phase-frequency detector configured to compare a reference frequency signal with a feedback frequency signal output from the controllable divider;
a two-point modulation control circuit including a first modulation path having a controllable gain and coupled to one of the first and second modulation control points and having a second modulation path coupled to another of the first and second modulation control points;
a calibration circuit comprising:
a phase detector circuit configured to compare the reference frequency signal with the feedback frequency signal to generate a phase detect signal; and
a gain control circuit configured to adjust the controllable gain of the first modulation path as a function of at least the phase detect signal.

17. The modulation circuit of claim 16, wherein the two-point modulation control circuit comprises a filter configured to receive an input modulation data and output filtered input modulation data to the first and second modulation paths.

18. The modulation circuit of claim 17, wherein the first is a Gaussian filter.

19. The modulation circuit of claim 16, wherein the gain control circuit comprises a correlation circuit configured to correlate the phase detect signal to a sign signal having sign values corresponding to the input modulation data.

20. The modulation circuit of claim 16, wherein the two-point modulation control circuit comprises an oversampling circuit configured to receive an input modulation data and output oversampled input modulation data to the first and second modulation paths.

21. The modulation circuit of claim 20, further comprising: a sign detector configured to determine signs of the oversampled input modulation data, and wherein the gain control circuit comprises a correlation circuit configured to correlate signs of the phase detect signal to the signs of the oversampled input modulation data.

22. The modulation circuit of claim 16, wherein the phase detector circuit is a bang-bang phase detector with the feedback frequency signal sampling the reference frequency signal.

23. A method for use in connection with the operation of a two-point modulator which includes a modulation path for generating a modulation voltage for application to a voltage controlled oscillator of a locked loop circuit, comprising the steps of:
oversampling input modulation data to generate oversampled modulation data;
detecting a sign of the oversampled modulation data to generate a sign signal;
phase comparing a reference frequency signal of the locked loop circuit to a feedback frequency signal of the locked loop circuit to generate a phase detect signal;
correlating the phase detect signal to the sign signal to generate a gain control signal, wherein values of the sign signal correspond to the input modulation data; and
adjusting a gain of the modulation path for generating the modulation voltage as a function of at least the gain control signal.

24. The method of claim 23, further comprising:
filtering the oversampled modulation data; and
processing the filtered and oversampled modulation data through the modulation path.

25. The method of claim 23, wherein correlating comprises comparing a sign of the phase detect signal to a sign of the sign signal to generate the gain control signal.

26. The method of claim 23, wherein phase comparing comprises bang-bang phase detecting with the feedback frequency signal sampling the reference frequency signal.

27. A modulation circuit, comprising:
a locked loop circuit comprising:
a voltage controlled oscillator configured to output an output frequency signal;
a phase-frequency detector configured to compare a reference frequency signal with a feedback frequency signal derived from the output frequency signal to generate a voltage control signal; and
a summing circuit configured to add a first modulation control signal to the voltage control signal for application to an input of voltage controlled oscillator; and
a calibration circuit comprising:
a phase detector circuit configured to compare the reference frequency signal with the feedback frequency signal to generate a phase detect signal;
a circuit configured to generate the first modulation control signal in response to input modulation data, wherein a gain of the first modulation control signal is set by a gain control signal; and
a gain control circuit configured to generate the gain control signal as a function of the phase detect signal.

28. The modulation circuit of claim 27, wherein the locked loop circuit further comprises a controllable frequency divider configured to receive the output frequency signal and generate the feedback frequency signal in response to a second modulation control signal generated in response to the input modulation data.

29. The modulation circuit of claim 27, wherein the gain control circuit comprises a correlation circuit configured to correlate the phase detect signal to a sign signal to generate the gain control signal, wherein values of the sign signal correspond to the input modulation data.

30. The modulation circuit of claim 29, further comprising an oversampling circuit configured to oversample the input modulation data and generate oversampled modulation data and wherein the calibration circuit further comprises a sign detector configured to detect a sign of the oversampled modulation data and output the sign signal.

31. The modulation circuit of claim 27, wherein the phase detector circuit is a bang-bang phase detector with the feedback frequency signal sampling the reference frequency signal.

32. The modulation circuit of claim 27, wherein the gain control circuit is configured to generate the gain control signal as a function of a comparison of the phase detect signal to the input modulation data.

33. The modulation circuit of claim 27, wherein the gain control circuit comprises a correlation circuit configured to correlate the phase detect signal to the input modulation data to generate the gain control signal.

* * * * *